(12) United States Patent
Chen et al.

(10) Patent No.: US 9,812,187 B2
(45) Date of Patent: Nov. 7, 2017

(54) TERMINATION TOPOLOGY OF MEMORY SYSTEM AND ASSOCIATED MEMORY MODULE AND CONTROL METHOD

(71) Applicant: MEDIATEK INC., Hsin-Chu (TW)

(72) Inventors: Shang-Pin Chen, Hsinchu County (TW); Bo-Wei Hsieh, Hsinchu (TW)

(73) Assignee: MEDIATEK INC., Hsin-Chu (TW)

( * ) Notice: Subject to any disclaimer, the term of this patent is extended or adjusted under 35 U.S.C. 154(b) by 0 days.

(21) Appl. No.: 15/424,882

(22) Filed: Feb. 5, 2017

(65) Prior Publication Data
US 2017/0243629 A1    Aug. 24, 2017

Related U.S. Application Data

(63) Continuation-in-part of application No. 15/390,692, filed on Dec. 26, 2016.

(60) Provisional application No. 62/363,379, filed on Jul. 18, 2016, provisional application No. 62/362,079, filed on Jul. 14, 2016, provisional application No. 62/298,005, filed on Feb. 22, 2016, provisional application No. 62/298,005, filed on Feb. 22, 2016.

(51) Int. Cl.
| | |
|---|---|
| *G11C 11/40* | (2006.01) |
| *G11C 11/4076* | (2006.01) |
| *G11C 11/4093* | (2006.01) |
| *G11C 5/06* | (2006.01) |
| *G11C 7/22* | (2006.01) |

(52) U.S. Cl.
CPC ...... *G11C 11/4076* (2013.01); *G11C 11/4093* (2013.01); *G11C 5/06* (2013.01); *G11C 7/22* (2013.01)

(58) Field of Classification Search
CPC .. G11C 5/06; G11C 5/063; G11C 7/22; G11C 7/222; G11C 11/4076; G11C 11/4093
USPC ................. 365/189.17, 63, 149, 206, 210.11
See application file for complete search history.

(56) References Cited

U.S. PATENT DOCUMENTS

| | | | |
|---|---|---|---|
| 7,161,820 B2* | 1/2007 | Funaba | G11C 5/04 361/728 |
| 2002/0067654 A1 | 6/2002 | Grundon | |
| 2003/0043683 A1* | 3/2003 | Funaba | G11C 5/063 365/230.03 |
| 2003/0067824 A1 | 4/2003 | Janzen | |
| 2003/0137860 A1 | 7/2003 | Khatri | |
| 2004/0000959 A1 | 1/2004 | Howard | |
| 2008/0112233 A1 | 5/2008 | Woo | |
| 2008/0291747 A1 | 11/2008 | Goodwin | |
| 2010/0109704 A1 | 5/2010 | Carr | |
| 2010/0327902 A1 | 12/2010 | Shau | |

(Continued)

*Primary Examiner* — Tan T. Nguyen
(74) *Attorney, Agent, or Firm* — Winston Hsu

(57) ABSTRACT

A memory system includes a memory controller and a memory module. The memory controller is arranged for selectively generating at least a clock signal and an inverted clock signal. The memory module includes a first termination resistor, a second termination resistor and a switch module, where a first node of the first termination resistor is to receive the clock signal, a second termination resistor, wherein a first node of the second termination resistor is to receive the inverted clock signal, and the switch module is arranged for selectively connecting or disconnecting a second node of the second termination resistor to a second node of the first termination resistor.

20 Claims, 5 Drawing Sheets

(56) References Cited

U.S. PATENT DOCUMENTS

2014/0301125 A1* 10/2014 Yoon .................. G11C 7/109
                                                    365/63
2015/0071017 A1   3/2015 Huang
2015/0364176 A1* 12/2015 Lee .................. G06F 11/079
                                                    714/57

\* cited by examiner

US 9,812,187 B2

TERMINATION TOPOLOGY OF MEMORY SYSTEM AND ASSOCIATED MEMORY MODULE AND CONTROL METHOD

CROSS REFERENCE TO RELATED APPLICATION

This continuation-in-part application claims the benefit of co-pending U.S. application Ser. No. 15/390,692, filed on Dec. 26, 2016, which claims the benefit of U.S. Provisional Application No. 62/298,005, filed on Feb. 22, 2016, which is incorporated herein by reference.

This application claims the priority of U.S. Provisional Application No. 62/298,005, filed on Feb. 22, 2016, U.S. Provisional Application No. 62/362,079, filed on Jul. 14, 2016, and U.S. Provisional Application No. 62/363,379, filed on Jul. 18, 2016, which is included herein by reference in its entirety.

BACKGROUND

A conventional dynamic random access memory (DRAM) module generally includes on-die termination for impedance matching of signal lines, and signal distortion can be reduced by using the on-die termination. The conventional on-die termination is generally connected to a reference voltage such as a ground voltage, however, this design is not able to optimize the signal quality.

SUMMARY

It is therefore an objective of the present invention to provide an on-die termination topology, which can improve the signal quality more, to solve the above-mentioned problem.

According to one embodiment of the present invention, a memory system comprises a memory controller and a memory module. The memory controller is arranged for selectively generating at least a clock signal and an inverted clock signal. The memory module comprises a first termination resistor, a second termination resistor and a switch module, where a first node of the first termination resistor is to receive the clock signal, a second termination resistor, wherein a first node of the second termination resistor is to receive the inverted clock signal, and the switch module is arranged for selectively connecting or disconnecting a second node of the second termination resistor to a second node of the first termination resistor.

According to another embodiment of the present invention, a memory module comprises a memory interface circuit, a first termination resistor, a second termination resistor and a switch module. The memory interface circuit is arranged for receives at least a clock signal and an inverted clock signal from a memory controller, a first node of the first termination resistor is to receive the clock signal, a first node of the second termination resistor is to receive the inverted clock signal, and the switch module is arranged for selectively connecting or disconnecting a second node of the second termination resistor to a second node of the first termination resistor.

According to another embodiment of the present invention, a control method of a memory module is provided, wherein the memory module comprises a first termination resistor and a second termination resistor, and the control method comprises: receiving a clock signal at a first node of the first termination resistor; receiving an inverted clock signal at a first node of the second termination resistor; and selectively connecting or disconnecting a second node of the second termination resistor to a second node of the first termination resistor.

These and other objectives of the present invention will no doubt become obvious to those of ordinary skill in the art after reading the following detailed description of the preferred embodiment that is illustrated in the various figures and drawings.

DETAILED DESCRIPTION

Certain terms are used throughout the following description and claims to refer to particular system components. As one skilled in the art will appreciate, manufacturers may refer to a component by different names. This document does not intend to distinguish between components that differ in name but not function. In the following discussion and in the claims, the terms "including" and "comprising" are used in an open-ended fashion, and thus should be interpreted to mean "including, but not limited to . . . " The terms "couple" and "couples" are intended to mean either an indirect or a direct electrical connection. Thus, if a first device couples to a second device, that connection may be through a direct electrical connection, or through an indirect electrical connection via other devices and connections.

Figure 1:
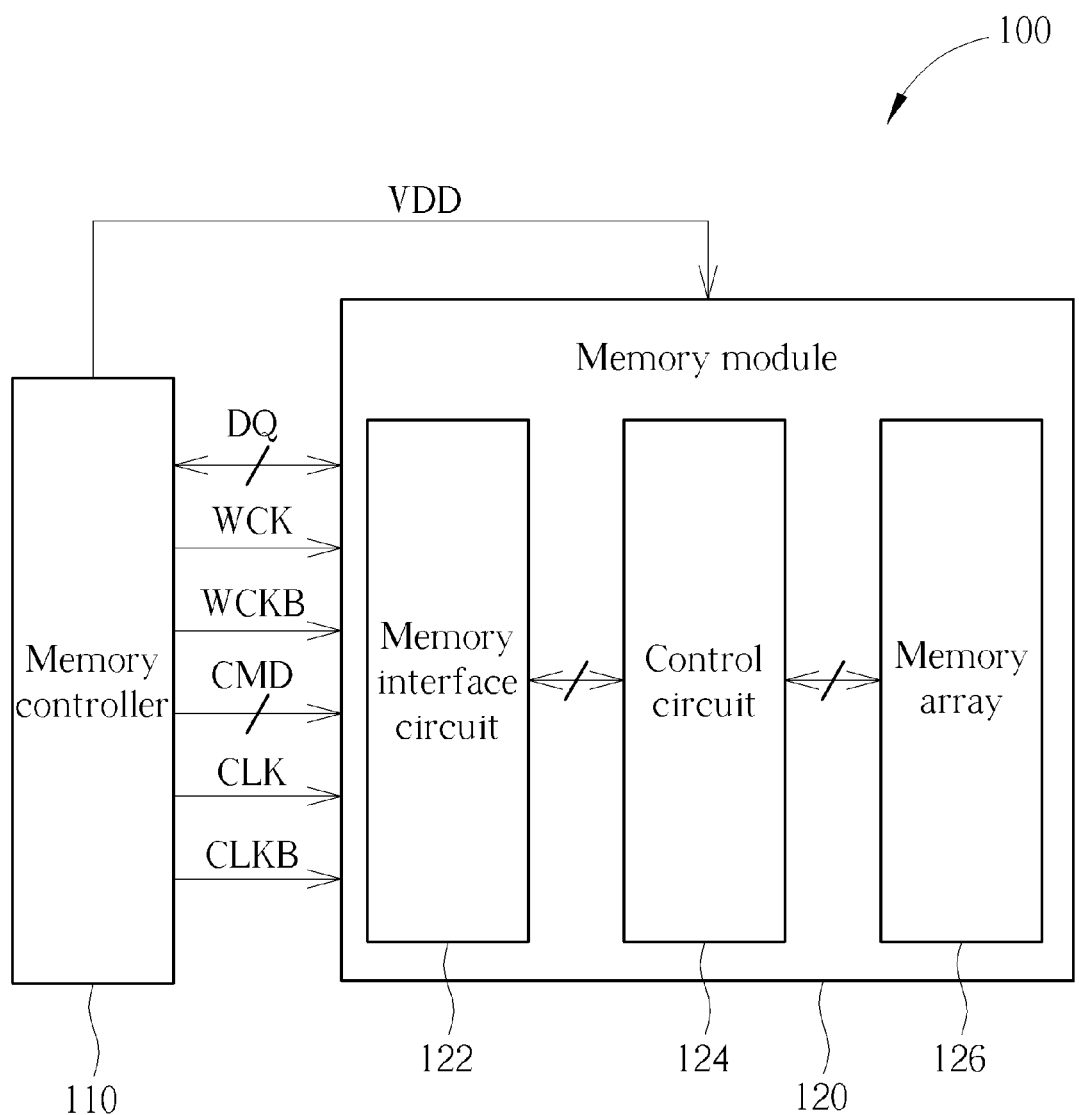
FIG. 1 is a diagram illustrating a memory system according to one embodiment of the present invention.

Please refer to FIG. 1, which is a diagram illustrating a memory system 100 according to one embodiment of the present invention. As shown in FIG. 1, the memory system 100 comprises a memory controller 110 and a memory module 120 supplied by a supply voltage VDD, where the memory module 120 comprises a memory interface circuit 122, a control circuit 124 and a memory array 126. In this embodiment, the memory controller 110 and the memory module 120 are connected via a plurality of connection lines, where the connection lines are used to transmit a plurality of bi-directional data signals DQs, a write clock signal WCK, an inverted write clock signal WCKB, a plurality of command signals CMDs, a clock signal CLK, and an inverted clock signal CKB. In this embodiment, the memory system 100 is a volatile memory system such as a DRAM system, that is the memory controller 110 is the DRAM memory controller, and the memory module 120 is a DRAM memory module.

When the memory system 100 is implemented by the DRAM system, the command signals may comprise at least a row address strobe, a column address strobe, and a write enable signal. In addition, the write clock signal WCK and the inverted write clock signal WCKB are arranged for data signal (DQs) latch in the memory module 120, and the clock signal CLK and the inverted clock signal CLKB are arranged for command signal (CMDs) latch in the memory module 120, and a frequency of the write clock signal WCK is greater than or equal to a frequency of the clock signal CLK. For example, the memory module 120 may use the write clock signal WCK and the inverted write clock signal WCKB to sample and store the data signal for subsequent signal processing, and the memory module 120 may use the clock signal CLK and the inverted clock signal CLKB to sample and store the command signal for subsequent signal processing.

In the operations of the memory system 100, the memory controller 110 is arranged to receive a request from a host or a processor, and to transmit at least a portion of the data signal DQ, command signals CMDs, the clock signal CLK, the inverted clock signal CLKB, the write clock signal WCK and the inverted write clock signal WCKB to access the memory module 120. In addition, the memory controller 110 may comprise associated circuits, such as an address decoder, a processing circuit, a write/read buffer, a control logic and an arbiter, to perform the related operations. The memory interface circuit 122 comprises a plurality of pads/pins and associated receiving circuit, and the memory interface circuit 122 is arranged to receive the data signal DQs, the write clock signal WCK, the inverted write clock signal WCKB, the command signals CMDs, the clock signal CLK, and the inverted clock signal CKB from the memory controller 110, and to selectively output the received signals to the control circuit 124. The control circuit 124 may comprise a read/write controller, a row decoder and a column decoder, and the control circuit 124 is arranged to receive the signals from the memory interface circuit 122 to access the memory array 126.

Because the embodiments of the present invention focus on the connections of the on-die termination, detailed descriptions about the other elements are therefore omitted here.

Figure 2:
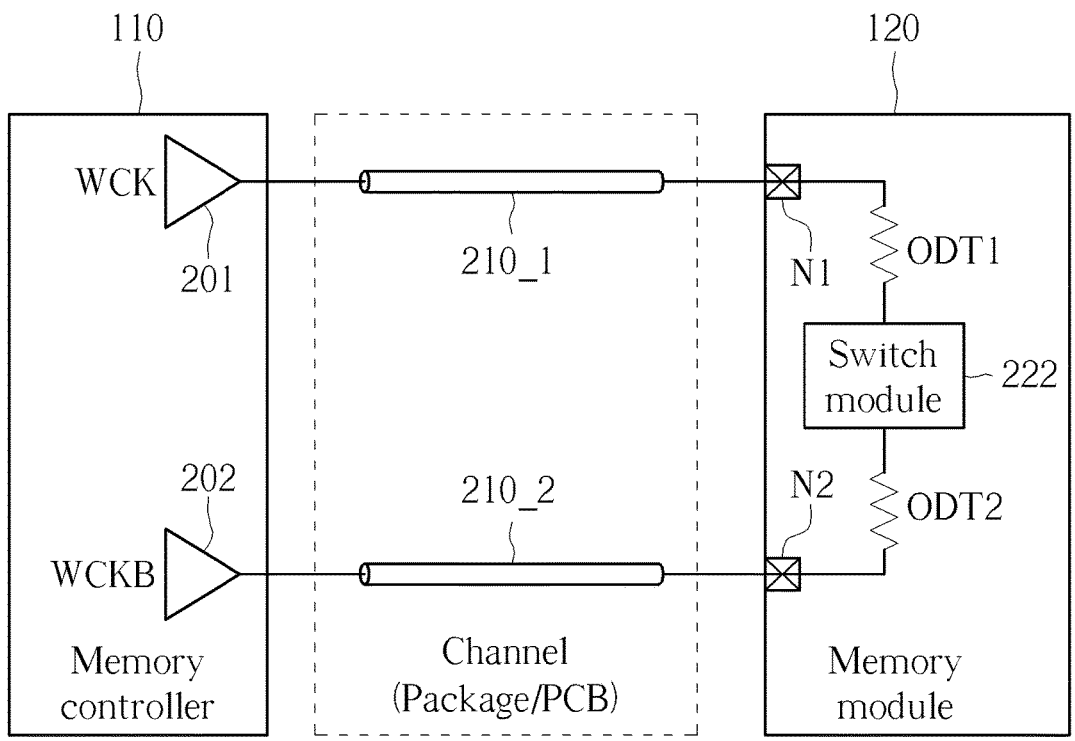
FIG. 2 is a diagram illustrating on-die termination design of the memory system according to one embodiment of the present invention.
Figure 3:
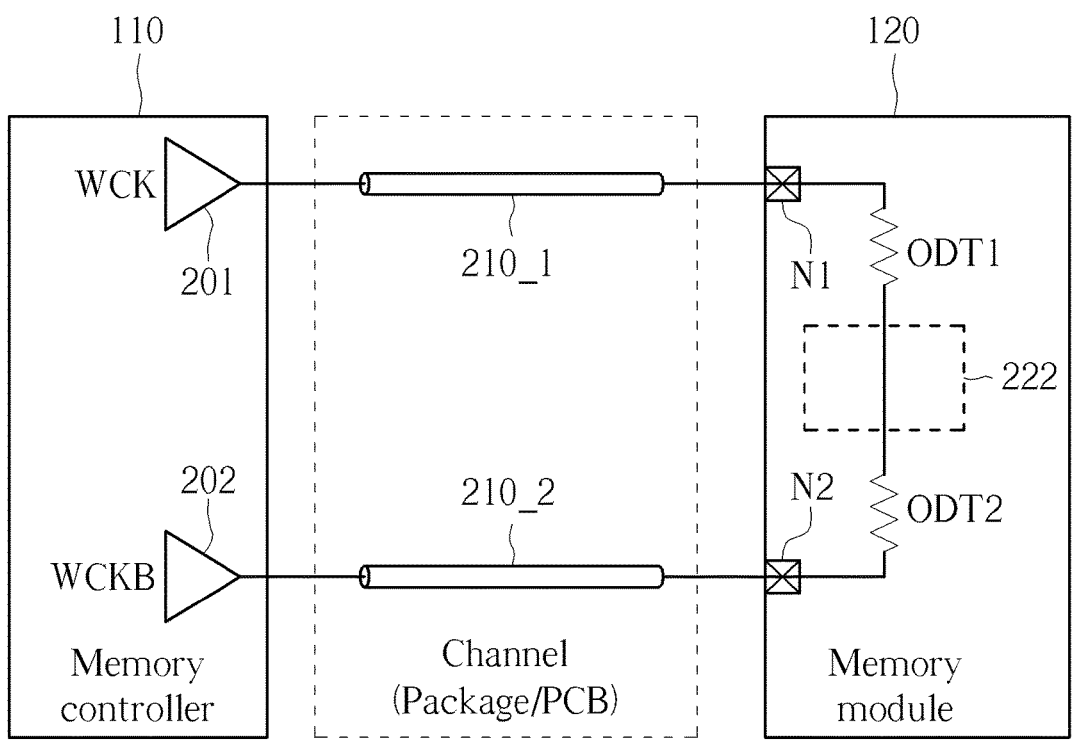
FIG. 3 is a diagram showing that the two termination resistors are connected to each other through the switch module.

Please refer to FIG. 2, which is a diagram illustrating on-die termination design of the memory system 100 according to one embodiment of the present invention. As shown in FIG. 2, the memory interface circuit 122 within the memory module 120 comprises two termination resistors ODT1 and ODT2 and a switch module 222, where the two termination resistors ODT1 and ODT2 are used for impedance matching of the connection lines, and the switch module 222 selectively connects or disconnects the termination resistor ODT1 to the termination resistor ODT2. In this embodiment, when the memory controller 110 sends a command signal that requires using the write clock signal WCK and the inverted write clock signal WCKB during the command operation, such as a read command, a write command or a masked write command, the control circuit 124 of the memory module 120 refers to the received command signal to turn on the on-die termination operation, and the switch module 222 is controlled by a circuit such as the control circuit 124 to make the termination resistor ODT1 to connect to the termination resistor ODT2 as shown in FIG. 3, and the write clock signal WCK is connected to the inverted write clock signal WCKB through the termination resistors ODT1 and ODT2. In this embodiment, the two termination resistors ODT1 and ODT2 can be implemented by metal-oxide semiconductor (MOS), metal wire, poly silicon or any other suitable resistors whose resistance is capable of being calibrated/adjusted, and at this time the two termination resistors ODT1 and ODT2 are not directly connecting to any bias voltage such as a ground voltage or a supply voltage. In detail, when the write clock signal WCK is at high voltage level and the inverted write clock signal WCKB is at low voltage level, a current flows from a driver 201, a channel 210_1, a pad N1, the two termination resistors ODT1 and ODT2, a pad N2, a channel 210_2 to a driver 202; and when the write clock signal WCK is at low voltage level and the inverted write clock signal WCKB is at high voltage level, a current flows from the driver 202, the channel 210_2, the pad N2, the two termination resistors ODT1 and ODT2, the pad N1, the channel 210_1 to the driver 201. In this embodiment, the channels 210_1 and 210_2 may be the transmission lines on a package or a printed circuit board (PCB).

By using the on-die termination connections shown in FIG. 3, the impedance matching can be more accurate, and the reflection of the signal can be lowered to improve the signal integrity.

Figure 4:
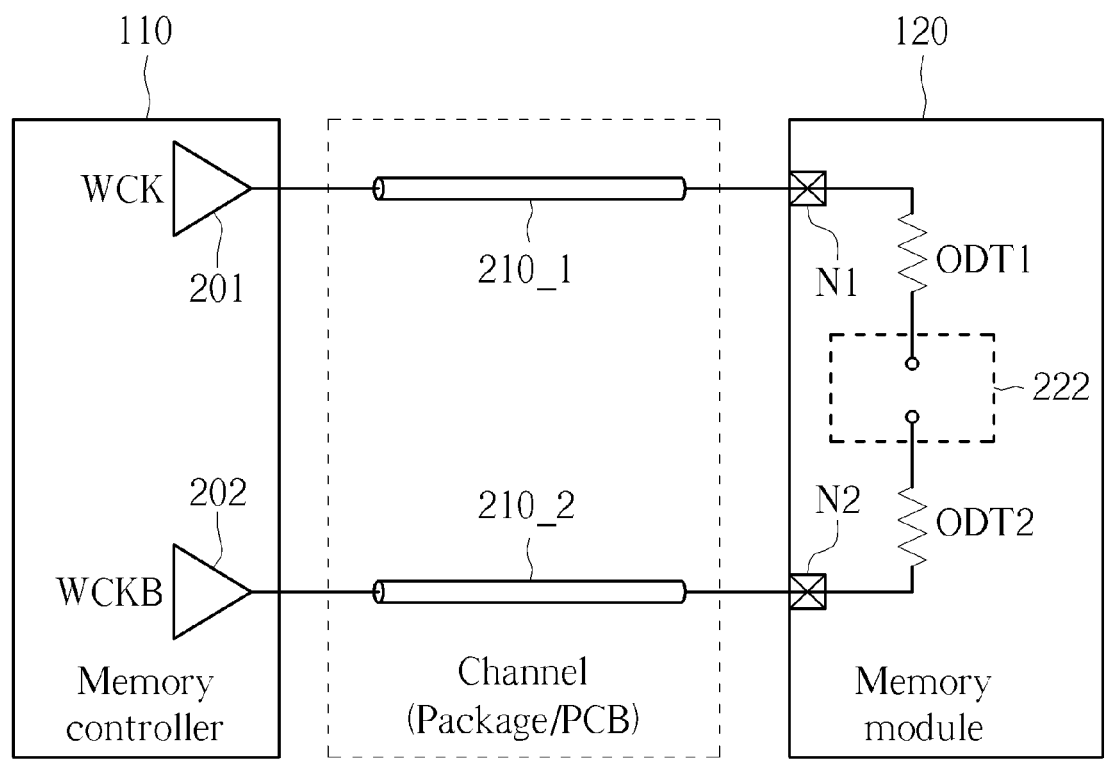
FIG. 4 is a diagram showing that the two termination resistors are at open states.

When the memory controller 110 does not send the command signal to the memory module 120, or the memory controller 110 sends the command signal that does not require using the write clock signal WCK and the inverted write clock signal WCKB during the command operation, the control circuit 124 of the memory module 120 may turn off the on-die termination operation, and the switch module 122 is controlled by a circuit such as the control circuit 124 to disconnect the termination resistors ODT1 and ODT2 to make a node of each of the termination resistors ODT1 and ODT2 is at an open state as shown in FIG. 4.

In addition, the memory interface circuit 122 shown in FIG. 1 generally comprises a plurality of buffers (not shown) to receive the signals from the memory controller 110, where the buffers can be controlled to output the received signals to the control circuit 124 or not to output the received signals to the control circuit 124. Conventionally, when a buffer is controlled from an off state to an on state, a glitch may occur and the buffers may output unstable signals or inappropriate signals. To solve this problem, when the memory controller 110 does not send the command signal to the memory module 120, or the memory controller 110 sends the command signal that does not require using the write clock signal WCK and the inverted write clock signal WCKB during the command operation, the channel 210_1 and the channel 210_2 (or the pads N1 and N2) are controlled to have fixed differential voltage levels in order to save power consumption and improve signal quality/accuracy. For example, the driver 201 may pull up the voltage level of the channel 210_1 and the pad N1 while the driver 202 may pull down the voltage level of the channel 210_2 and the pad N2; or the driver 201 may pull down the voltage level of the channel 210_1 and the pad N1 while the driver 202 may pull up the voltage level of the channel 210_2 and the pad N2.

In addition, a quantity of the termination resistors shown in FIG. 2 is for illustrative purposes only, not a limitation of the present invention. As long as the memory module 120 has at least one termination resistor for allowing the write clock signal WCK to connect to the inverted write clock signal WCKB via the switch module 222, the quantity of the termination resistors within the memory module 120 can be determined according to designer's consideration.

Figure 5:
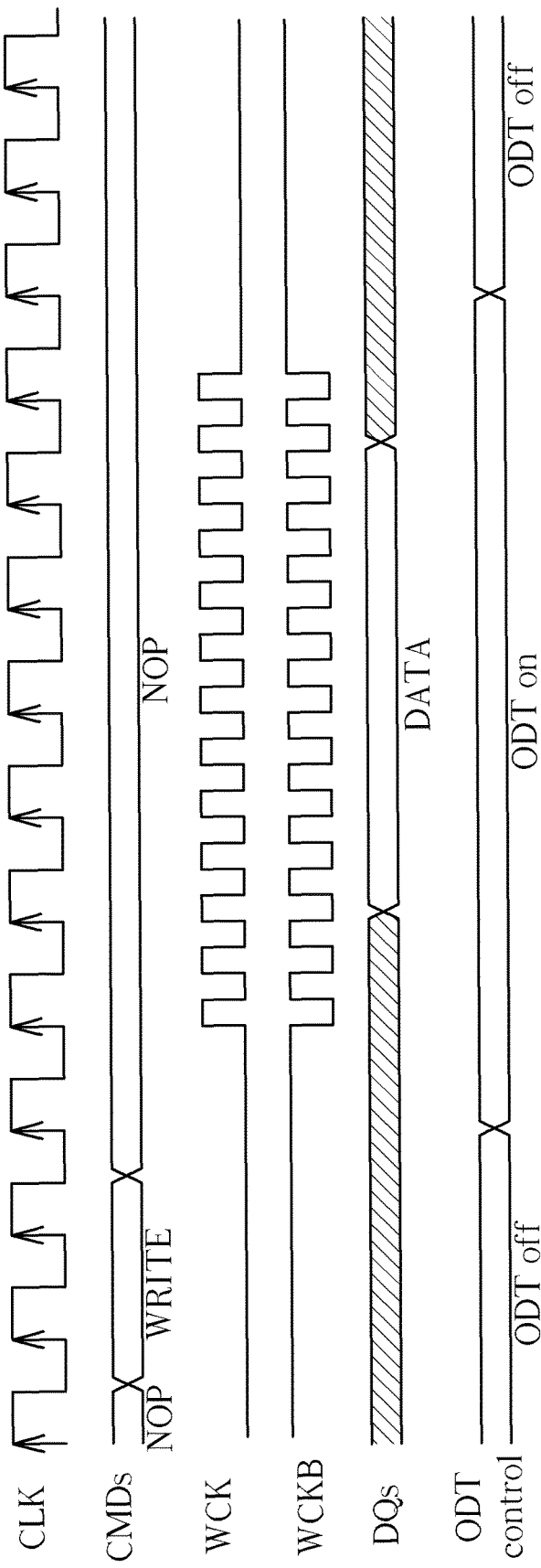
FIG. 5 is a timing diagram of signals of the memory system according to one embodiment of the present invention.

Please refer to FIG. 5, which is a timing diagram of signals of the memory system 100 according to one embodiment of the present invention. As shown in FIG. 5, initially when the memory controller 110 does not send the command signal to the memory module 120, or the memory controller 110 sends the command signal that does not require using the write clock signal WCK and the inverted write clock signal WCKB during the command operation (that is "NOP"

shown in FIG. 5), the on-die termination operation is turned off and the switch module 222 is turned off, the channel 210_1 and pad N1 corresponds to the write clock signal WCK is at a low voltage level, and the channel 210_2 and pad N2 corresponds to the inverted write clock signal WCKB is at a high voltage level. Then, when the memory controller 110 receives a request from a host or a processor to write data into the memory module 120, the memory controller 110 sends a write command to the memory module 120. After receiving the write command, the memory module 120 turns on the ODT operation, and the switch module 222 turns on to connect the termination resistors ODT1 and ODT2 to each other. Then, the memory controller 110 enables the write clock signal WCK and the inverted write clock signal WCKB (i.e. the write clock signal WCK and the inverted write clock signal WCKB are toggled), and the data from the memory controller 110 is written into the memory module 120 by using the write clock signal WCK and the inverted write clock signal WCKB. After the data is written into the memory module 120 successfully, the memory controller 110 stop outputting the write clock signal WCK and the inverted write clock signal WCKB, and the memory controller 110 controls the channel 210_1 and pad N1 corresponding to the write clock signal WCK at the low voltage level, and the memory controller 110 controls the channel 210_2 and pad N2 corresponding to the inverted write clock signal WCKB at the high voltage level. Then, the memory module 120 turns off the ODT operation, and the switch module 222 turns off to disconnect the termination resistors ODT1 and ODT2.

Figure 6:
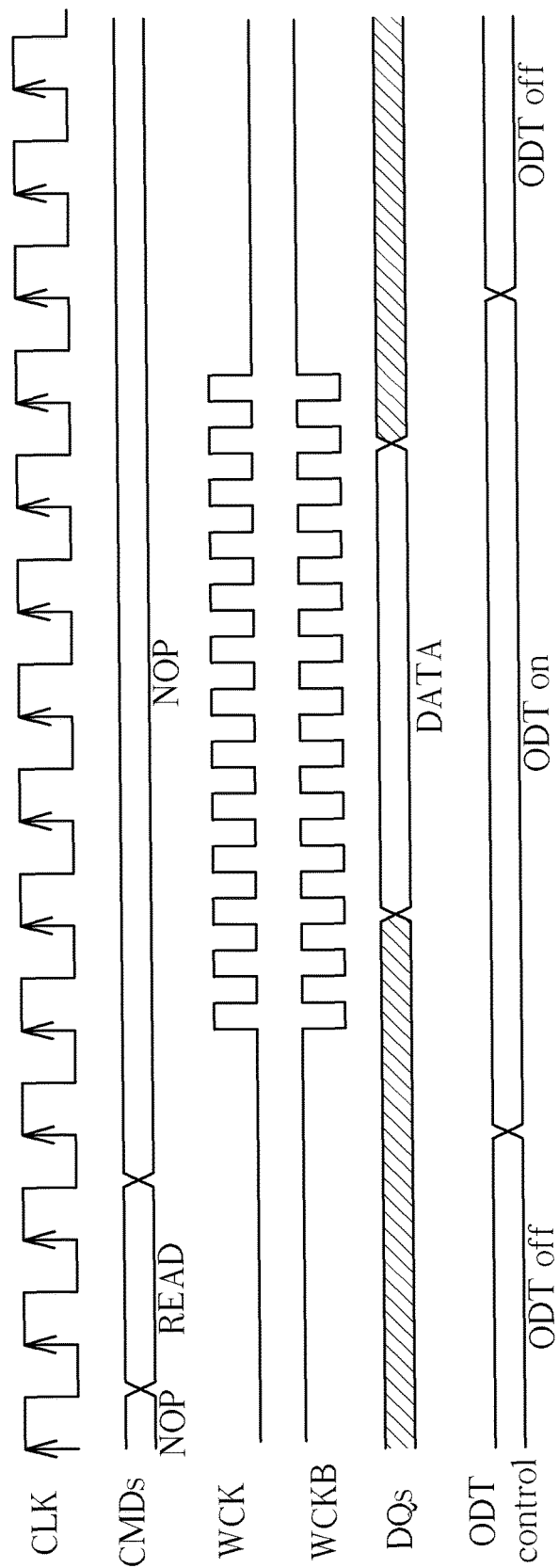
FIG. 6 is a timing diagram of signals of the memory system according to another embodiment of the present invention.

Please refer to FIG. 6, which is a timing diagram of signals of the memory system 100 according to another embodiment of the present invention. As shown in FIG. 6, initially when the memory controller 110 does not send the command signal to the memory module 120, or the memory controller 110 sends the command signal that does not require using the write clock signal WCK and the inverted write clock signal WCKB during the command operation (that is "NOP" shown in FIG. 5), the on-die termination operation is turned off and the switch module 222 is turned off, the channel 210_1 and pad N1 corresponds to the write clock signal WCK is at a low voltage level, and the channel 210_2 and pad N2 corresponds to the inverted write clock signal WCKB is at a high voltage level. Then, when the memory controller 110 receives a request from a host or a processor to read data from the memory module 120, the memory controller 110 sends a read command to the memory module 120. After receiving the read command, the memory module 120 turns on the ODT operation, and the switch module 222 turns on to connect the termination resistors ODT1 and ODT2 to each other. Then, the memory controller 110 enables the write clock signal WCK and the inverted write clock signal WCKB (i.e. the write clock signal WCK and the inverted write clock signal WCKB are toggled), and the data is read from the memory array 126 by using the write clock signal WCK and the inverted write clock signal WCKB. After the data is read by the memory controller 110 successfully, the memory controller 110 stop outputting the write clock signal WCK and the inverted write clock signal WCKB, and the memory controller 110 controls the channel 210_1 and pad N1 corresponding to the write clock signal WCK at the low voltage level, and the memory controller 110 controls the channel 210_2 and pad N2 corresponding to the inverted write clock signal WCKB at the high voltage level. Then, the memory module 120 turns off the ODT operation, and the switch module 222 turns off to disconnect the termination resistors ODT1 and ODT2.

Briefly summarized, in the on-die termination topology of the present invention, the clock signal is allowed to connect the inverted clock signal in die via a switch module. Therefore, the impedance matching can be more accurate, and the reflection of the signal can be lowered to improve the signal integrity.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A memory system, comprising:
a memory controller, for selectively generating at least a clock signal and an inverted clock signal; and
a memory module, coupled to the memory controller, wherein the memory module receives at least the clock signal and the inverted clock signal from the memory controller, and the memory module comprises:
a first termination resistor, wherein a first node of the first termination resistor is to receive the clock signal;
a second termination resistor, wherein a first node of the second termination resistor is to receive the inverted clock signal; and
a switch module, couple between the first termination resistor and the second termination resistor, for selectively connecting or disconnecting a second node of the second termination resistor to a second node of the first termination resistor.

2. The memory system of claim 1, wherein the memory module receives the clock signal and the inverted clock signal at two pads of the memory module, respectively; and when the switch module is controlled to connect the second node of the second termination resistor to the second node of the first termination resistor, the first termination resistor, the second termination resistor and the switch module build a current path between the two pads within the memory module.

3. The memory system of claim 1, wherein when the switch module is controlled to disconnect the second node of the second termination resistor to the second node of the first termination resistor, the second node of the first termination resistor and the second of the second termination resistor are at open state.

4. The memory system of claim 1, wherein the memory controller selectively generates the clock signal and the inverted clock signal to the memory module via a first channel and a second channel, respectively; and when the memory controller does not generate the clock signal and the inverted clock signal, the memory controller keeps the first channel and the second channel at fixed differential voltage levels.

5. The memory system of claim 1, wherein the switch module selectively connects or disconnects the second node of the second termination resistor to the second node of the first termination resistor according to a command signal transmitted from the memory controller to the memory module.

6. The memory system of claim 5, wherein when command signal corresponds to a command that requires the clock signal and the inverted clock signal during a command operation, the switch module connects the second node of the second termination resistor to the second node of the first termination resistor.

7. The memory system of claim 6, wherein the memory controller selectively generates the clock signal and the inverted clock signal to the memory module via a first channel and a second channel, respectively; and when the memory controller does not generate the command signal corresponding to the command that requires the clock signal and the inverted clock signal during the command operation, the memory controller keeps the first channel and the second channel at fixed differential voltage levels, and the switch module disconnects the second node of the second termination resistor to the second node of the first termination resistor; and once the memory controller generates the command signal corresponds to the command that requires the clock signal and the inverted clock signal during the command operation, the switch module connects the second node of the second termination resistor to the second node of the first termination resistor, then the memory controller generates the clock signal and the inverted clock signal to the memory module.

8. The memory system of claim 1, wherein the memory system is a dynamic random access memory (DRAM) system, each of the first termination resistor and the second termination resistor is an on-die termination, and the clock signal is for data signal latch within the memory module.

9. A memory module, comprising:
a memory interface circuit, for receives at least a clock signal and an inverted clock signal from a memory controller, and the memory interface circuit comprises:
a first termination resistor, wherein a first node of the first termination resistor is to receive the clock signal;
a second termination resistor, wherein a first node of the second termination resistor is to receive the inverted clock signal; and
a switch module, couple between the first termination resistor and the second termination resistor, for selectively connecting or disconnecting a second node of the second termination resistor to a second node of the first termination resistor.

10. The memory module of claim 9, wherein the memory interface circuit comprises two pads for receiving the clock signal and the inverted clock signal, respectively; and when the switch module is controlled to connect the second node of the second termination resistor to the second node of the first termination resistor, the first termination resistor, the second termination resistor and the switch module build a current path between the two pads within the memory module.

11. The memory module of claim 9, wherein when the switch module is controlled to disconnect the second node of the second termination resistor to the second node of the first termination resistor, the second node of the first termination resistor and the second of the second termination resistor are at open state.

12. The memory module of claim 9, wherein the switch module selectively connects or disconnects the second node of the second termination resistor to the second node of the first termination resistor according to a command signal transmitted from the memory controller.

13. The memory module of claim 12, wherein when command signal corresponds to a command that requires the clock signal and the inverted clock signal during a command operation, the switch module connects the second node of the second termination resistor to the second node of the first termination resistor.

14. The memory module of claim 13, wherein the memory interface circuit comprises two pads for receiving the clock signal and the inverted clock signal, respectively; when the memory module does not receive the command signal corresponding to the command that requires the clock signal and the inverted clock signal during the command operation, the two pads keep at fixed differential voltage levels, and the switch module disconnects the second node of the second termination resistor to the second node of the first termination resistor; and once the memory module receives the command signal corresponds to the command that requires the clock signal and the inverted clock signal during the command operation, the switch module connects the second node of the second termination resistor to the second node of the first termination resistor, then the two pads receive the clock signal and the inverted clock signal from the memory controller, respectively.

15. A control method of a memory module, wherein the memory module comprises a first termination resistor and a second termination resistor, and the control method comprises:
receiving a clock signal at a first node of the first termination resistor;
receiving an inverted clock signal at a first node of the second termination resistor; and
selectively connecting or disconnecting a second node of the second termination resistor to a second node of the first termination resistor.

16. The control method of claim 15, wherein the memory module comprises two pads for receiving the clock signal and the inverted clock signal, respectively, and the step of selectively connecting or disconnecting the second node of the second termination resistor to the second node of the first termination resistor comprises:
connecting the second node of the second termination resistor to the second node of the first termination resistor to build a current path within the memory module.

17. The control method of claim 15, wherein the step of selectively connecting or disconnecting the second node of the second termination resistor to the second node of the first termination resistor comprises:
disconnecting the second node of the second termination resistor to the second node of the first termination resistor to make the second node of the first termination resistor and the second of the second termination resistor at open states.

18. The control method of claim 15, wherein the step of selectively connecting or disconnecting the second node of the second termination resistor to the second node of the first termination resistor comprises:
selectively connecting or disconnecting the second node of the second termination resistor to the second node of the first termination resistor according to a command signal transmitted from the memory controller.

19. The control method of claim 18, wherein the step of selectively connecting or disconnecting the second node of the second termination resistor to the second node of the first termination resistor according to the command signal transmitted from the memory controller comprises:
when command signal corresponds to a command that requires the clock signal and the inverted clock signal during a command operation, connecting the second node of the second termination resistor to the second node of the first termination resistor.

20. The control method of claim 19, wherein the memory module comprises two pads for receiving the clock signal and the inverted clock signal, respectively, and the step of selectively connecting or disconnecting the second node of the second termination resistor to the second node of the first termination resistor comprises:

when the memory module does not receive the command signal corresponding to the command that requires the clock signal and the inverted clock signal during the command operation, keeping two pads keep at fixed differential voltage levels, and disconnecting the second node of the second termination resistor to the second node of the first termination resistor; and once the memory module receives the command signal corresponds to the command that requires the clock signal and the inverted clock signal during the command operation, connecting the second node of the second termination resistor to the second node of the first termination resistor, then using the two pads to receive the clock signal and the inverted clock signal from the memory controller, respectively.

* * * * *